(12) United States Patent
Sievert et al.

(10) Patent No.: US 10,031,162 B2
(45) Date of Patent: Jul. 24, 2018

(54) CURRENT DETECTION DEVICE AND METHOD FOR SENSING AN ELECTRIC CURRENT

(71) Applicant: Robert Bosch GmbH, Stuttgart (DE)

(72) Inventors: Holger Sievert, Ludwigsburg (DE); Stefan Butzmann, Schalksmühle (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/117,754

(22) PCT Filed: Dec. 16, 2014

(86) PCT No.: PCT/EP2014/077946
§ 371 (c)(1),
(2) Date: Aug. 10, 2016

(87) PCT Pub. No.: WO2015/120931
PCT Pub. Date: Aug. 20, 2015

(65) Prior Publication Data
US 2016/0356817 A1    Dec. 8, 2016

(30) Foreign Application Priority Data

Feb. 13, 2014    (DE) .................. 10 2014 202 634

(51) Int. Cl.
*G01R 1/28* (2006.01)
*G01R 19/00* (2006.01)
*G01R 15/08* (2006.01)

(52) U.S. Cl.
CPC .............. *G01R 1/28* (2013.01); *G01R 15/08* (2013.01); *G01R 19/0046* (2013.01); *G01R 19/0092* (2013.01)

(58) Field of Classification Search
CPC ............ G01R 19/0092; G01R 19/0046; G01R 15/08; G01R 1/28
See application file for complete search history.

(56) References Cited

U.S. PATENT DOCUMENTS 5,200,878 A    4/1993  Sasagawa et al.
5,877,617 A *  3/1999  Ueda ..................... G05F 3/247
                                                  323/315

(Continued)

FOREIGN PATENT DOCUMENTS

JP    H05276761    10/1993
JP    2003202355   7/2003

(Continued)

OTHER PUBLICATIONS

International Search Report for Application No. PCT/EP2014/077946 dated Mar. 20, 2015 (English Translation, 2 pages).

*Primary Examiner* — Jermele M Hollington
*Assistant Examiner* — Suresh K Rajaputra
(74) *Attorney, Agent, or Firm* — Michael Best & Friedrich LLP

(57) ABSTRACT

The invention relates to a method and a device for detecting a current in a measuring path, the current in said measuring path corresponding to a current in a power path. An electric current is detected by a current measuring instrument in the measuring path, while simultaneously part of the electric current is conducted parallel to the current measuring instrument by a bypass device, in order to reduce the load on the current measuring instrument.

10 Claims, 2 Drawing Sheets

(56) References Cited

U.S. PATENT DOCUMENTS

| | | | | |
|---|---|---|---|---|
| 2006/0221523 A1* | 10/2006 | Colombi | ................ | H02J 9/062 361/90 |
| 2011/0025299 A1* | 2/2011 | Vulovic | .............. | G01R 15/002 324/115 |
| 2011/0221424 A1* | 9/2011 | McNamara | ............ | G01R 1/203 324/126 |

FOREIGN PATENT DOCUMENTS

| | | |
|---|---|---|
| JP | 2004198143 | 7/2004 |
| JP | 2012186899 | 9/2012 |
| WO | 2015008461 | 1/2015 |

\* cited by examiner

CURRENT DETECTION DEVICE AND METHOD FOR SENSING AN ELECTRIC CURRENT

BACKGROUND OF THE INVENTION

The present invention relates to a current evaluation circuit and a method for sensing an electric current. In particular, the present invention relates to a current detection device and a method for sensing an electric current on a measuring path, which carries an electric current corresponding to an electric current on a power path.

Although the present invention is described in relation with IGBT which have a sense terminal, the present invention can be used additionally also for any other cases of application in which a current is to be evaluated on a further current path which corresponds to the current on a power path.

Printed document U.S. Pat. No. 5,877,617 A discloses a circuit arrangement in which a load on a current path is fed with a current. In addition, the circuit arrangement comprises a further transistor which provides a current corresponding to this current for the load. The current which is provided by the further transistor is used for monitoring and evaluating the current flow for the load.

For the measurement and evaluation of the current through a semiconductor switch, bipolar transistors having an insulated gate (IGBT) are also known in which, at an additional sense terminal, a current is provided which is proportional to the main current through the semiconductor switch. The current from the sense terminal is then lower by an approximately constant factor than the main current on the emitter path of the IGBT.

The circuit arrangement for evaluating the current in the sense path of such an IGBT must then be dimensioned for the maximum on-period of the IGBT and also for the maximum current occurring. In this context, relatively large currents can occur also on the sense path, especially in the case of a fault.

There is, therefore, a requirement for a device and a method for current detection which enables currents to be detected with high accuracy over a relatively wide measuring range.

SUMMARY OF THE INVENTION

For this purpose, the present invention, according to a first aspect, creates a current detection device for detecting an electric current on a measuring path which carries an electric current corresponding to an electric current on a power path, comprising a current measuring device which is arranged on the measuring path and which is designed to provide an output signal which corresponds to an electric current which flows through the current measuring device, and a bypass device which is designed to adjust an electric bypass current, wherein the bypass current is adjusted in dependence on the electric current on the measuring path and the current measuring device and the bypass device is arranged in parallel on the measuring path.

According to a further aspect, the present invention creates a method for detecting an electric current on a measuring path which carries an electric current corresponding to an electric current on a power path, comprising the steps of arranging a current measuring device on a measuring path, arranging a bypass device on the measuring path, adjusting an electric current which flows through the bypass device, in dependence on the electric current which flows on the measuring path; and detecting an electric current which flows through the current measuring device.

In this context, the present invention is based on the concept of not always conducting the full current to be detected through the current measuring device during the detection of an electric current by a current measuring device. Instead, a part of the electric current is conducted past the current measuring device by a bypass device. For this purpose, the bypass device is arranged in parallel with the current measuring device.

Due to the parallel connection of current measuring device and bypass device, the maximum range of values within which the current measuring device detects an electric current can be designed for a lower maximum current value. Due to the lesser maximum range of values for which the current measuring device has to be designed, the current measuring device can thus also be implemented to be smaller and more cost effective.

In addition, such a current measuring device having a smaller maximum range of values also provides for a more precise and thus more accurate detection of the electric current to be detected within this range of values. Thus, the accuracy of the entire system can also be enhanced.

The current which flows through the bypass device and thus relieves the current measuring device can then be matched in dependence on the electric current detected by the current measuring device and thus in dependence on the entire electric current to be detected. In this manner, it is possible, on the one hand, to conduct a relatively large proportion of this current through the current measuring device with relatively low total currents whereas, on the other hand, only a small part of the current has to be evaluated by the current measuring device with relatively large total currents. This provides for a very great accuracy especially at low electric currents whereas, at the same time, the overall system can be relieved in the case of high currents.

According to one embodiment, the bypass device is designed not to let any electric bypass current flow through the bypass device when the electric current through the current measuring device falls below a predetermined first threshold value. In this manner, the entire electric current can be sensed and detected by the current measuring device at low electric currents. This provides for a very high accuracy at low electric currents.

According to one embodiment, the bypass device is designed to adjust an electric bypass current in parallel with the current measuring device when the electric current through the current measuring device exceeds a predetermined second threshold value. In this manner, a part of this electric current can be conducted past the current measuring device at relatively large electric currents so that the current measuring device is relieved at high electric currents and, therefore, has to be designed for a lower maximum current.

According to one embodiment, the bypass device is designed to adapt the bypass current in dependence on the output signal of the current measuring device. By means of such dynamic adapting of the bypass current in parallel with the current measuring device, the current which is conducted past the current measuring device can be adapted variably. For example, the bypass current can be increased continuously with increasing total current in parallel with the current measuring device. As an alternative, it is also possible to adapt the bypass current in parallel with the current measuring device in several stages differently in dependence on the total current.

According to one embodiment, the bypass device is designed to limit the electric current through the current measuring device to a predetermined maximum limit value. By this means, the maximum current through the current measuring device can be limited which renders it possible that the current measuring device is not overloaded even with very high electric currents. In this case, the current measuring device outputs a constant output signal above the predetermined maximum limit value which also does not rise further even with the current rising further on the measuring path.

According to one embodiment, the output signal which is provided by the current measuring device is a voltage signal. Such voltage signals are particularly well suited for further processing in a downstream system.

According to one embodiment, the output signal provided by the current measuring device is converted into a digital signal by an analog/digital converter. Converting the analog output signal into a digital signal also enables the measured quantity to be processed further digitally.

According to one embodiment, the bypass device comprises a reference voltage source. The reference voltage source is designed to provide a predetermined reference voltage. The bypass device is designed to compare a voltage signal with the reference voltage provided by the reference voltage source. In dependence on the comparison, the bypass device adjusts an electric bypass current in parallel with the current measuring device. By defining one or more reference points in the form of voltages of one or more reference voltage sources, it is then possible to specify the proportion of current which is conducted past by the bypass device in parallel with the current measuring device, in a simple manner.

According to one embodiment, the bypass device comprises a current mirror circuit. In this arrangement, the bypass device is designed to activate the current mirror circuit based on the comparison between voltage signal and the reference voltage. By using a current mirror circuit, the current which is conducted past the current measuring device by the bypass device can be adjusted well.

The present invention also relates to a circuit arrangement for providing an electric current. This circuit arrangement comprises a current control device which is designed to provide an electric current on a power path. The current control device is also designed to provide on a measuring path an electric measuring current corresponding to the electric current provided on the power path. The circuit arrangement also comprises a current detection device according to the invention.

According to one embodiment, the current control device comprises a bipolar transistor having an insulated gate (IGBT). The IGBT preferably comprises a sense terminal at which a measuring current corresponding to the power path is provided.

BRIEF DESCRIPTION OF THE DRAWINGS

Further advantages and embodiments of the present invention are apparent in the subsequent description, referring to the attached drawings.

DETAILED DESCRIPTION

Although the present invention will be described in the text which follows with reference to a bipolar transistor and having an insulted gate (IGBT) which has a sense terminal for providing a measuring current, the invention can also be applied additionally to further circuit arrangements for providing an electric current in which an electric current on a power path is to be evaluated by means of a further current on a measuring path.

Figure 1:
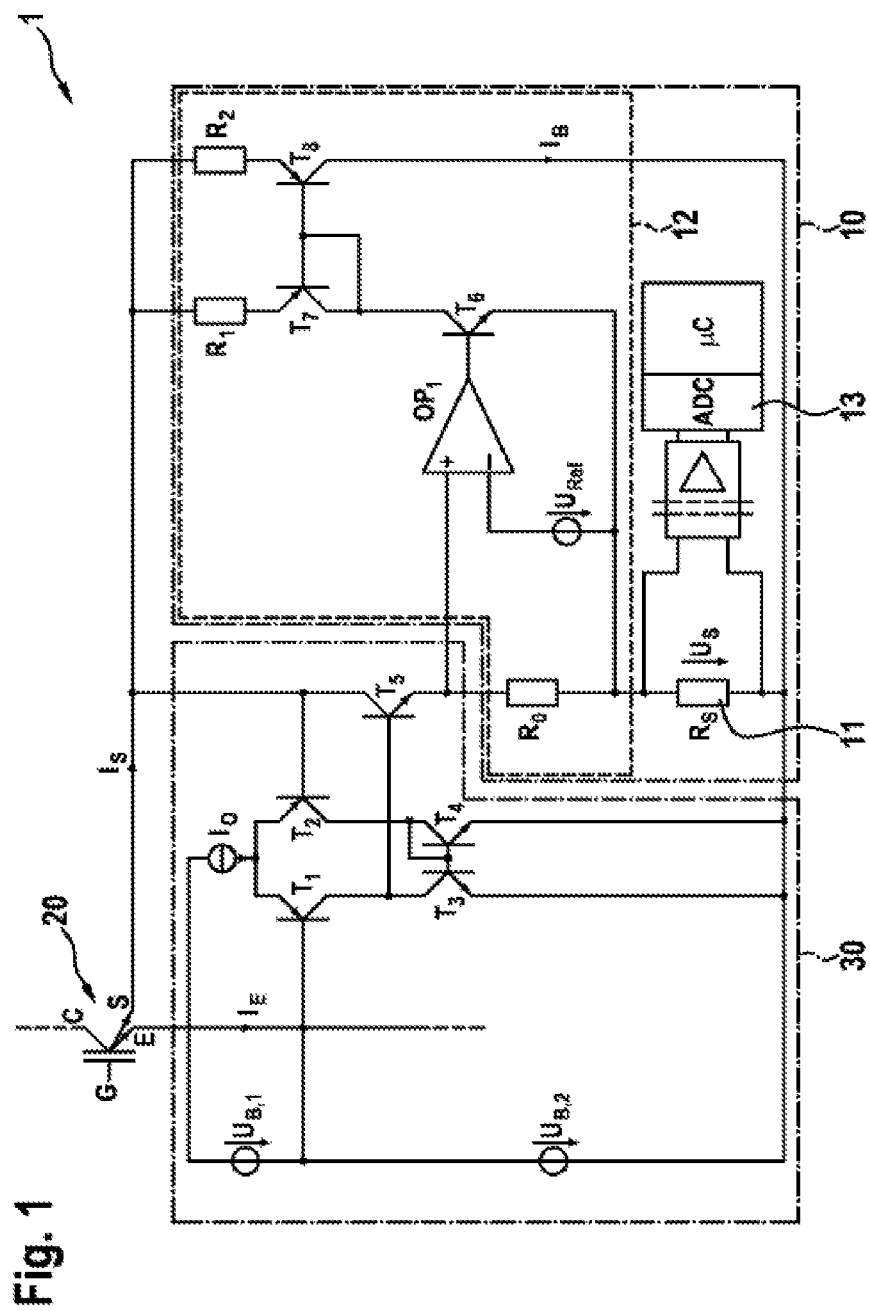
FIG. 1: shows a diagrammatic representation of a circuit diagram for a circuit arrangement for providing an electric current with a current detection device according to one exemplary embodiment.

FIG. 1 shows a diagrammatic representation of a circuit arrangement 1 for providing an electric current. The circuit arrangement 1 comprises a current control device 20, for example an IGBT. The IGBT has then a control terminal G. On the basis of a control signal present at this control terminal G, an electric current $I_E$ can be adjusted on a power path between the input C and the output E of the IGBT. At a sense terminal S, the IGBT outputs a measuring current which corresponds to the electric current $I_E$ on the power path. With constant boundary conditions such as, for example, constant temperature and identical substrate characteristics, a fixed transfer ratio exists between the current $I_E$ on the power path and the measuring current $I_s$ on the measuring path. However, this requires that identical voltage ratios are set at output E and the sense terminal S of the IGBT.

To adjust these identical voltage ratios at the output E and sense terminal S of the IGBT, the circuit arrangement 1 comprises a compensation circuit 30. In the exemplary embodiment shown in FIG. 1, the compensation circuit 30 comprises, for example, the two voltage sources $U_{B.1}$ and $U_{B.2}$ and the current source $I_0$. Furthermore, the compensation circuit 30 comprises transistors $T_1$ to $T_5$. Other compensation circuits which are suitable for adjusting the required voltage ratios at output E and sense terminal S of the IGBT are additionally also possible.

In this context, the detection of the electric current $I_s$ on the measuring path is effected by the current detection device 10. The measuring current $I_S$ here flows initially through the transistor $T_5$ of the compensation circuit 30 and the resistor $R_0$ of the current detection device 10, and through the current measuring device 11. In the example shown here, the current measuring device 11 is formed by the shunt resistor $R_s$. Across a shunt resistor $R_s$, a voltage $U_s$ which is proportional to the current flowing through this resistor is dropped. This voltage drop $U_s$ can here be provided as output signal which represents a measuring quantity corresponding to the current $I_s$. Optionally, the voltage $U_s$ can also be converted by the shunt resistor $R_s$ into a digital signal by means of an analog/digital converter 13. Thus, digital further processing of the measuring quantity detected is also possible. Furthermore, the current $I_E$ on the power path can be inferred from the analog or digital signal detected in this manner by means of, for example, suitable scaling. The complete measuring current $I_s$, and thus also the current $I_E$ in the power path, can also be inferred by suitable downstream scaling in the case of analog processing of the output signal, for example of the voltage $U_s$ via the shunt resistor $R_s$.

To lower the current through the shunt resistor $R_s$ at relatively high measuring currents $I_s$, the current through the shunt resistor $R_s$ can be reduced by connecting a bypass path in parallel. For this purpose, the current detection device 10 comprises a bypass device 12. The bypass device 12 then comprises the resistor $R_0$ which is arranged in series with the shunt resistor $R_s$. The voltage drop across this resistor $R_0$ is supplied to an input of an operational amplifier OP. The operational amplifier OP compares this voltage drop with the output voltage of a reference voltage source $U_{Ref}$. The output signal of the operational amplifier OP is supplied to the control input of a transistor $T_6$ which can in turn activate a current mirror circuit of transistors $T_7$ and $T_8$ and the two resistors $R_1$ and $R_2$. If the voltage drop across the resistor $R_0$ exceeds the voltage provided by the reference voltage $U_{Ref}$, the transistor $T_6$ is activated by the operational amplifier OP as a result of which the current mirror circuit sets a bypass current $I_B$. This bypass current $I_B$ thus flows in parallel with the current through the shunt resistor $R_S$. In this manner, the measuring current $I_s$ is divided so that a current through the shunt resistor $R_S$ is correspondingly reduced by the bypass current $I_B$ as soon as the voltage drop across the resistor $R_0$ is greater than the voltage of the reference voltage source $U_{Ref}$. In this case, the voltage $U_s$ across the shunt resistor $R_S$ no longer increases proportionally to the full measuring current $I_s$ with increasing measuring current $I_s$. Instead, the voltage drop is then reduced by a proportion which is proportional to the bypass current $I_B$. In this manner, the current through the shunt resistor $R_S$, and thus also the voltage rise across the shunt resistor $R_S$ is correspondingly reduced with large measuring currents $I_s$. This flattened curve of the output signal with increasing measuring current $I_s$ can be taken into consideration during a subsequent evaluation of the output signal of the current detection device 10 and compensated for in order to again infer the full measuring current $I_s$ and thus the current $I_E$ on the power path.

Figure 2:
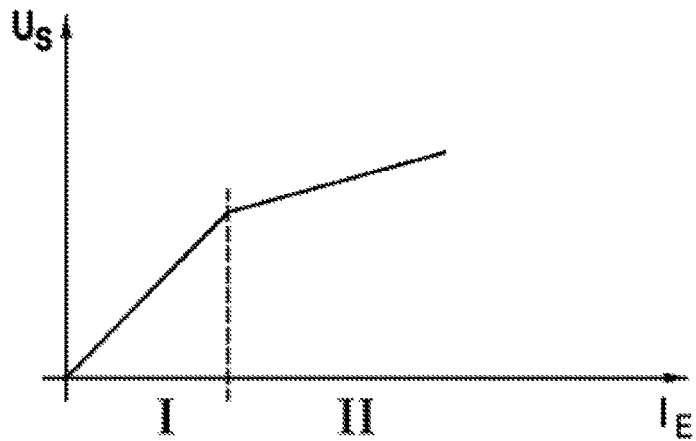
FIG. 2: shows a diagrammatic representation of a voltage/current diagram having a characteristic and forms the basis of a current detection device according to one exemplary embodiment.

FIG. 2 shows a diagrammatic representation of a current/voltage diagram for the relationship between the measuring current $I_s$ and the voltage drop $U_s$ across the shunt resistor $R_S$. In a first range I, the voltage rise is initially completely proportional to the measuring current $I_s$. If the measuring current $I_s$ exceeds a predetermined limit value, a bypass current $I_B$ begins to flow in the bypass device 12. The steepness of the current/voltage characteristic is thus reduced in section II. In this manner, it is possible to provide the first section I with a relatively large sensitivity so that with relatively low measuring currents $I_s$, there is great steepness of the current/voltage characteristic. This provides for very good resolution at relatively low measuring currents $I_s$, and accurate evaluation of small currents. In addition, the steepness of the current/voltage characteristic can be reduced at relatively large measuring currents $I_s$ in the second area II so that no excessively large output signals occur even with relatively large measuring currents $I_s$. Thus, a smaller dynamic range of the output signal $U_s$ is obtained over a very large dynamic range of the measuring current $I_s$, at which, nevertheless, relatively low measuring currents $I_s$ can be resolved very well.

For the purpose of further optimization, it is additionally also possible that, instead of a single kink in the current/voltage characteristic, there are also more than two part areas in which the steepness of the current/voltage characteristic is in each case different. For this purpose, the circuit arrangement according to FIG. 1 can be extended, for example, by using more bypass branches, or there is a comparison of several reference voltages which in each case activate a common bypass branch differently. Further alternatives for adapting the steepness of the current/voltage characteristic in several part areas are additionally also possible.

So that the current detection device 10 is not overloaded too much even at very high measuring currents $I_s$, the maximum current which flows through the shunt resistor $R_S$ can be limited to a maximum value. In this case, the bypass device 12 is configured in such a manner that a further rise in the measuring current $I_s$ flows completely via the bypass branch and does not lead to further rise of the current through the current measuring device 11.

Figure 3:
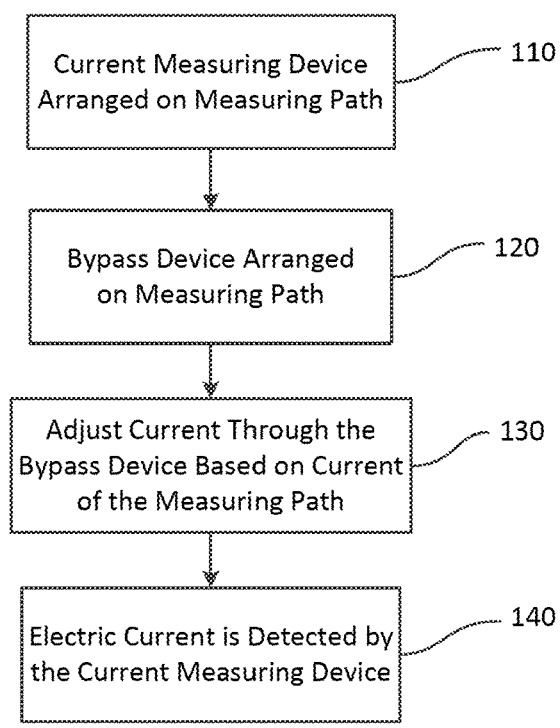
FIG. 3: shows a diagrammatic representation of a flow chart for a method for detecting an electric current as forms the basis of an exemplary embodiment.

FIG. 3 shows a diagrammatic representation of a flow chart for a method 100 for detecting an electric current on a measuring path which carries an electric current corresponding to an electric current on a power path as it forms the basis in one embodiment. The method 100 then comprises firstly a step 110 for arranging a current measuring device in a measuring path. In step 120, a bypass device is additionally arranged on the measuring path.

In step 130, an electric current through the bypass device 12 is adjusted in dependence on the current on the measuring path. Following this, an electric current is detected by the current measuring device in step 140. A suitable output signal can be output corresponding to the detected current. The output signal can be scaled thereupon in order to compensate for the bypass current not detected by the current measuring device 11 and to infer the current $I_E$ on the power path by means of a suitable transfer factor.

In summary, the present invention relates to a method and to a device for detecting a current on a measuring path, the current on this measuring path corresponding to a current on a power path. For this purpose, an electric current is detected on the measuring path by a current measuring device whereas, at the same time, a part of the electric current is conducted in parallel to the current measuring device by a bypass device in order to thus relieve the current measuring device.

The invention claimed is:

1. A current detection device (10) for detecting an electric measuring current ($I_s$) on a measuring path, the electric measuring current ($I_s$) corresponding to an electric current ($I_E$) on a power path, the current detection device comprising:
    a current measuring device (11) which is arranged on the measuring path and which is designed to provide an output signal which corresponds to an electric current which flows through the current measuring device (11), and
    a bypass device (12) including a current mirror circuit arranged in parallel with the current measuring device (11) and a resistor ($R_0$) arranged in series with the current measuring device (11), wherein the bypass device (12) is designed to adjust an electric bypass current ($I_B$) in dependence on the electric measuring current ($I_s$) by activating the current mirror circuit when the voltage drop across the resistor ($R_0$) is greater than a predetermined reference voltage.

2. The current detection device (10) as claimed in claim 1, wherein the bypass device (12) is designed so that no electric bypass current flows through the bypass device (12) when the electric measuring current ($I_s$) drops below a predetermined first threshold value.

3. The current detection device (10) as claimed in claim 1, wherein the bypass device (12) is designed to adjust an electric bypass current ($I_B$) in parallel with the current measuring device (11) when the electric measuring current ($I_s$) exceeds a predetermined second threshold value.

4. The current detection device (10) as claimed in claim 1, wherein the bypass device (12) is designed to adapt the electric bypass current ($I_B$) in dependence on the output signal of the current measuring device (11).

5. The current detection device (10) as claimed in claim 1, wherein the bypass device (12) is designed to limit the electric current through the current measuring device (11) to a predetermined maximum limit value.

6. The current detection device (10) as claimed in claim 1, wherein the bypass device (12) further includes a reference voltage source ($U_{Ref}$) which is designed to provide the predetermined reference voltage and the bypass device (12) is designed to compare the voltage drop across the resistor ($R_O$) with the predetermined reference voltage provided by the reference voltage source ($U_{Ref}$) and to adjust the electric bypass current ($I_B$) in parallel with the current measuring device (11) in dependence on the comparison.

7. A circuit arrangement (1) for providing an electric current ($I_E$), comprising:
    a current control device (20) which is designed to provide an electric current ($I_E$) on a power path and to provide an electric measuring current ($I_s$) corresponding to the provided electric current ($I_E$) on a measuring path, and
    a current detection device (10) as claimed in claim 1.

8. The circuit arrangement (1) as claimed in claim 7, wherein the current control device (20) comprises a bipolar transistor having an insulated gate, IGBT.

9. A method (100) for detecting an electric current on a measuring path, the electric current corresponding to an electric current on a power path, the method comprising:
    arranging (110) a current measuring device (11) on a measuring path,
    arranging (120) a bypass device (12) on the measuring path, the bypass device including a current mirror circuit arranged in parallel with the current measuring device (11) and a resistor ($R_O$) arranged in series with the current measuring device (11), wherein the bypass device is designed to adjust an electric bypass current ($I_B$),
    adjusting (130) an electric current ($I_B$) which flows through the bypass device (12) in dependence on the electric current which flows on the measuring path by activating the current mirror circuit when the voltage drop across the resistor ($R_O$) is greater than a predetermined reference voltage, and
    detecting (140) an electric current which flows through the current measuring device (11).

10. The current detection device (10) as claimed in claim 1, wherein the output signal is scaled in order to compensate for the bypass current not detected by the current measuring device (11) and to infer the electric current ($I_E$) on the power path by means of a suitable transfer factor.

* * * * *